US010585211B2

(12) United States Patent
Zabeida et al.

(10) Patent No.: US 10,585,211 B2
(45) Date of Patent: Mar. 10, 2020

(54) ARTICLE HAVING OPTIMISED THERMOMECHANICAL PROPERTIES, COMPRISING A LAYER OF TITANO-ORGANIC NATURE

(71) Applicants: CORPORATION DE L'ECOLE POLYTECHNIQUE DE MONTREAL, Montreal (CA); ESSILOR INTERNATIONAL (COMPAGNIE GENERAL D'OPTIQUE), Charenton le Pont (FR)

(72) Inventors: Oleg Zabeida, Cote Saint-luc (CA); Thomas Schmitt, Montreal (CA); Jolanta Sapieha, Pointe Claire (CA); Ludvik Martinu, Montreal (CA); Karin Scherer, Charenton le Pont (FR)

(73) Assignees: CORPORATION DE L'ECOLE POLYTECHNIQUE DE MONTREAL, Montreal (CA); ESSILOR INTERNATIONAL, Charenton-le-Pont (FR)

( * ) Notice: Subject to any disclaimer, the term of this patent is extended or adjusted under 35 U.S.C. 154(b) by 379 days.

(21) Appl. No.: 15/306,835

(22) PCT Filed: Apr. 28, 2014

(86) PCT No.: PCT/FR2014/051016
§ 371 (c)(1),
(2) Date: Oct. 26, 2016

(87) PCT Pub. No.: WO2015/166144
PCT Pub. Date: Nov. 5, 2015

(65) Prior Publication Data
US 2017/0052285 A1 Feb. 23, 2017

(51) Int. Cl.
G02B 1/111 (2015.01)
C23C 14/08 (2006.01)
C23C 14/12 (2006.01)
C23C 14/30 (2006.01)
G02B 1/04 (2006.01)

(52) U.S. Cl.
CPC ............ G02B 1/111 (2013.01); C23C 14/083 (2013.01); C23C 14/12 (2013.01); C23C 14/30 (2013.01); G02B 1/041 (2013.01)

(58) Field of Classification Search
CPC ..... C07D 471/04; C23C 14/083; C23C 14/12; C23C 14/30; G02B 1/041; G02B 1/111
See application file for complete search history.

(56) References Cited

U.S. PATENT DOCUMENTS

| 5,508,368 | A | 4/1996 | Knapp et al. | |
|---|---|---|---|---|
| 6,183,872 | B1 | 2/2001 | Tanaka et al. | |
| 6,919,134 | B2 | 7/2005 | Mitsuishi et al. | |
| 2004/0124531 | A1* | 7/2004 | Venkatraman | .......... C23C 16/30 257/751 |
| 2004/0146723 | A1* | 7/2004 | Mitsuishi | ................ G02B 1/111 428/447 |
| 2004/0151918 | A9* | 8/2004 | Mitsuishi | ................ G02B 1/111 428/447 |
| 2013/0050636 | A1* | 2/2013 | Fukagawa | .............. G02B 1/115 351/159.01 |

FOREIGN PATENT DOCUMENTS

| DE | 102012112780 | 5/2014 |
|---|---|---|
| EP | 1176434 | 1/2002 |
| EP | 1324078 | 7/2003 |
| EP | 2711744 | 3/2014 |
| JP | 05-323103 | 12/1993 |
| JP | 2005-187936 | 7/2005 |
| JP | 2007-078780 | 3/2007 |
| WO | WO2005/059603 | 7/2005 |
| WO | WO2007/064108 | 6/2007 |
| WO | WO2008/001011 | 1/2008 |
| WO | WO2008/015364 | 2/2008 |
| WO | WO2008/062142 | 5/2008 |
| WO | WO2009/047426 | 4/2009 |
| WO | WO2010/109154 | 9/2010 |
| WO | WO2011/080472 | 7/2011 |
| WO | WO2013/098531 | 7/2013 |

OTHER PUBLICATIONS

Nanoindentation NPL document, retrieved Oct. 11, 2019.*
Schiller, M. et al.: "PICVD—A Novel Technique for Hard-and AR-coating of Spectacles", SPIE Proceedings 3738, Advances in Optical Interference Coatings, 1999, Retrieved from the Internet: URL:http://proceedings.spiedigitallibrary.orgjproceeding.aspx?articleid=991774, [retrieved on Jan. 15, 2015] pp. 30-33.
Owens, D.K. et al.: "Estimation of the Surface Force Energy of Polymers", J. Appl. Sci., (1969), 13, pp. 1741-1747.

* cited by examiner

Primary Examiner — Michael B Nelson
(74) Attorney, Agent, or Firm — Norton Rose Fulbright US LLP

(57) ABSTRACT

The invention relates to an article comprising a substrate having at least one major surface coated with a layer A of a material obtained by ion beam assisted vacuum deposition of at least one titanium oxide and of at least one organo-silicate compound B, said material having a refractive index at 550 nm higher than or equal to 1.8, an extinction coefficient k at 550 nm lower than or equal to 0.02, and an H:E ratio higher than or equal to 0.046, where H and E designate the hardness of the material and the elastic coefficient of the material, respectively.

14 Claims, No Drawings

ARTICLE HAVING OPTIMISED THERMOMECHANICAL PROPERTIES, COMPRISING A LAYER OF TITANO-ORGANIC NATURE

CROSS-REFERENCE TO RELATED APPLICATIONS

This application is a national phase application under 35 U.S.C. § 371 of International Application No. PCT/FR2014/051016 filed 28 Apr. 2014, the entire contents of which is specifically incorporated by reference herein without disclaimer.

FIELD OF THE INVENTION

The present invention relates generally to an article, preferably an optical article, in particular an ophthalmic lens, possessing a layer of titano-organic nature, combining thermomechanical properties and high refractive index, and to a process for the preparation of such an article.

DESCRIPTION OF RELATED ART

It is known to treat ophthalmic glasses, whether they are mineral or organic, so as to prevent the formation of parasitic reflections which are a nuisance to the wearer of the lens and the people they are interacting with. The lens is then provided with a mono- or multilayer antireflective coating, generally made of mineral material, which exhibits, in the second case, an alternation of layers of high refractive index and of low refractive index.

A reflective coating produces the reverse effect, that is to say that it increases the reflection of the light rays. Such a type of coating is used, for example, to obtain a mirror effect in sunglass lenses.

During the edging and fitting of an eyeglass at an optician's practice, the eyeglass undergoes mechanical deformations which can produce cracks in the mineral reflective or antireflective interference coatings, in particular when the operation is not carried out with care. Similarly, thermal stresses (heating of the frame) can produce cracks in the interference coating. Depending on the number and the size of the cracks, the latter can interfere with the field of view of the wearer and prevent the eyeglass from being sold. Furthermore, while the treated organic eyeglasses are being worn, scratches can appear. In mineral interference coatings, some scratches lead to cracking, making the scratches more visible because of scattering of light.

One objective of the invention is to obtain a coating, in particular an interference coating and especially an antireflective coating, which has improved thermomechanical properties, while retaining a high refractive index, with preferably good adhesion properties. The invention is targeted in particular at articles possessing an improved critical temperature, that is to say exhibiting a good resistance to cracking when they are subjected to an increase in temperature. Another objective of the invention is to provide a process for the manufacture of an interference coating which is simple, easy to carry out and reproducible.

It is also known to deposit thin organic/inorganic layers by the liquid route. This deposition technique exhibits disadvantages, such as the difficulty of spreading and of polymerizing the layers without creating cracks on organic substrates, and the duration of the process, in particular when other coatings have to be deposited on these layers.

The application WO 2013/098531, on behalf of the applicant, describes an article having improved thermomechanical performances, comprising a substrate having at least one main surface coated with a multilayer interference coating, said coating comprising a layer A not formed from inorganic precursor compounds having a refractive index of less than or equal to 1.55, which constitutes:

either the external layer of the interference coating, or an intermediate layer, directly in contact with the external layer of the interference coating, this external layer of the interference coating being in this second case an additional layer having a refractive index of less than or equal to 1.55, said layer A having been obtained by deposition, under an ion beam, of activated entities resulting from at least one precursor compound C in the gaseous form of silico-organic nature, such as octamethylcyclotetrasiloxane (OMCTS).

The application EP 1 324 078 describes a lens coated with a multilayer antireflective coating comprising an alternation of layers of high and of low refractive index, the external layer of which is a layer of low refractive index (1.42-1.48) consisting of a hybrid layer, obtained by ion-assisted vacuum deposition simultaneously of an organic compound (for example, polyethylene glycol glycidyl ether, polyethylene glycol monoacrylate or N-(3-trimethoxysilylpropyl) gluconamide) and of at least one inorganic compound (silica or silica and alumina), that is to say by coevaporation of these different constituents.

The patent U.S. Pat. No. 6,919,134 describes an optical article comprising an antireflective coating comprising at least one layer known as "hybrid" obtained by coevaporation of an organic compound and an inorganic compound ($SiO_2$, $SiO_2+Al_2O_3$, $Nb_2O_5$, $Ta_2O_5$, $TiO_2$, $ZrO_2$ or $Y_2O_3$), which confers on it a better adhesion, a better thermal resistance and a better abrasion resistance. This layer is generally deposited by ion-assisted coevaporation, typically of silica and of a modified silicone oil.

The applications JP 2007-078780 and JP 05-323103 describe other multilayer optical stacks comprising hybrid organic-inorganic layers.

SUMMARY OF THE INVENTION

The inventors have found that the materials of the layers of high refractive index of the interference stacks were weaker than the materials of low refractive index and had a much lower thermal resistance. Thus, the inventors have developed a transparent material for a layer of high refractive index, which can be used in interference filters, making it possible to meet the objectives set. This material can be used to replace conventional materials of high refractive index, such as the titanium dioxide, in interference coatings.

According to the invention, the layer of material of high refractive index is formed by deposition, with the assistance of a source of ions, preferably under an ion beam, better still resulting from an ion gun, of activated entities, in the gaseous form, obtained from a precursor material of organic nature and from a precursor material of inorganic nature. It possesses improved thermomechanical properties while exhibiting a high refractive index and a high transparency.

The goals set are thus achieved according to the invention by an article comprising a substrate having at least one main surface coated with a layer A of a material obtained by vacuum deposition assisted by a source of ions, this assistance preferably being an ion bombardment, of at least one titanium oxide and of at least one organosilicon compound B, said material exhibiting:

a refractive index at 550 nm of greater than or equal to 1.8, an extinction coefficient k at 550 nm of less than or equal to 0.02, an H/E ratio of greater than or equal to 0.046, where H and E respectively denote the hardness of the material and the modulus of elasticity of the material.

The protocol for measuring H and E is described in the experimental part.

It is possible to refer to the standard NF EN ISO 14577 if need be.

H and E are expressed in the same unit (for example MPa or GPa).

The invention also relates to a process for the manufacture of such an article, comprising at least the following stages:

supplying an article comprising a substrate having at least one main surface, depositing, on said main surface of the substrate, a layer A of a material having a refractive index of greater than or equal to 1.8, an extinction coefficient k at 550 nm of less than or equal to 0.02 and an H/E ratio of greater than or equal to 0.046, where H and E have the meanings indicated above, recovering an article comprising a substrate having a main surface coated with a layer A, said layer A having been obtained by vacuum deposition with the assistance of a source of ions, preferably an ion bombardment, of at least one titanium oxide and of at least one organosilicon compound B.

DETAILED DESCRIPTION

In the present patent application, when an article comprises one or more coatings at its surface, the expression "to deposit a layer or a coating on the article" means that a layer or a coating is deposited on the uncovered (exposed) surface of the external coating of the article, that is to say its coating furthest from the substrate.

A coating which is "on" a substrate or which has been deposited "on" a substrate is defined as a coating which (i) is positioned above the substrate, (ii) is not necessarily in contact with the substrate (although it preferably is in contact), that is to say one or more intermediate coatings can be positioned between the substrate and the coating in question, and (iii) does not necessarily completely cover the substrate (although it preferably covers it). When "a layer 1 is located under a layer 2", it will be understood that the layer 2 is further from the substrate than the layer 1.

The article prepared according to the invention comprises a substrate, preferably a transparent substrate, having front and back main faces, at least one of said main faces and preferably both main faces comprising at least one layer A, which can be incorporated in an interference coating.

The "back face" of the substrate (the back face generally being concave) is understood to mean the face which, when the article is being used, is closest to the eye of the wearer. Conversely, the "front face" of the substrate (the front face generally being convex) is understood to mean the face which, when the article is being used, is furthest from the eye of the wearer.

Although the article according to the invention can be any article, such as a screen, a glazing unit, a pair of protective glasses which can be used in particular in a working environment, a mirror or an article used in electronics, it preferably constitutes an optical article, better still an optical lens and even better still an ophthalmic lens, for a pair of spectacles, or an optical or ophthalmic lens blank, such as a semi-finished optical lens, in particular a spectacle glass.

The lens can be a polarized or tinted lens or a photochromic or electrochromic lens. Preferably, the ophthalmic lens according to the invention exhibits a high transmission.

The layer A according to the invention can be formed on at least one of the main faces of a bare substrate, that is to say an uncoated substrate, or on at least one of the main faces of a substrate already coated with one or more functional coatings.

The substrate of the article according to the invention is preferably an organic glass, for example made of thermoplastic or thermosetting plastic. This substrate can be chosen from the substrates mentioned in the application WO 2008/062142, for example a substrate obtained by (co)polymerization of diethylene glycol bis(allyl carbonate), a substrate made of poly(thio)urethane or a substrate made of (thermoplastic) bisphenol A polycarbonate, denoted PC, or a substrate made of PMMA (polymethyl methacrylate).

Before the layer A is deposited on the substrate, which is optionally coated, for example with an abrasion-resistant and/or scratch-resistant coating, it is common to subject the surface of said optionally coated substrate to a physical or chemical activation treatment intended to increase the adhesion of the layer A. This pretreatment is generally carried out under vacuum. It may be a matter of a bombardment with energetic and/or reactive entities, for example a beam of ions (Ion Pre-Cleaning or IPC) or a beam of electrons, a corona discharge treatment, a glow discharge treatment, a UV treatment or a treatment by vacuum plasma, generally an oxygen or argon plasma. It may also be a matter of an acidic or basic surface treatment and/or a surface treatment with solvents (water or organic solvent). Several of these treatments can be combined. By virtue of these cleaning treatments, the cleanliness and the reactivity of the surface of the substrate are optimized.

Energetic (and/or reactive) entities are understood in particular to mean ionic entities having an energy preferably ranging from 1 to 300 eV, preferentially from 1 to 150 eV, better still from 10 to 150 eV and even better still from 40 to 150 eV. The energetic entities can be chemical entities, such as ions or radicals, or entities such as photons or electrons.

The preferred pre-treatment of the surface of the substrate is an ion bombardment treatment carried out by means of an ion gun, the ions being particles consisting of gas atoms from which one or more electron(s) have been stripped. Use is preferably made, as ionized gas, of argon ($Ar^+$ ions), but also of oxygen or of their mixtures, under an acceleration voltage generally ranging from 50 to 200 V, a current density generally of between 10 and 100 $\mu A/cm^2$ on the activated surface, and generally under a residual pressure in the vacuum chamber which can range from $8 \times 10^{-5}$ mbar to $2 \times 10^{-4}$ mbar.

The article according to the invention comprises a layer A, which preferably constitutes a high-index layer of a multilayer interference coating, preferentially a multilayer interference coating, which is in particular antireflective. Preferably, the external layer of such a multilayer (interference) coating, that is to say the layer of the (interference) coating furthest from the substrate in the order of stacking, is not a layer A according to the invention. In a preferred embodiment, the layer A constitutes the penultimate layer of the multilayer (interference) coating in the order of stacking and is found directly in contact with an external layer of low refractive index.

The layer A or said multilayer (interference) coating is preferably formed on an abrasion-resistant coating. The preferred abrasion-resistant coatings are coatings based on epoxysilane hydrolysates comprising at least two, preferably at least three, hydrolysable groups bonded to the silicon atom. The preferred hydrolysable groups are alkoxysilane groups.

The interference coating can be any interference coating conventionally used in the field of optics, in particular of ophthalmic optics, except for the fact that it comprises a layer A according to the invention. The interference coating can be, without limitation, an antireflective coating or a reflective (mirror) coating, preferably an antireflective coating.

An antireflective coating is defined as a coating, deposited at the surface of an article, which improves the antireflective properties of the final article. It makes it possible to reduce the reflection of light at the article-air interface over a relatively broad portion of the visible spectrum.

As is well known, interference coatings, preferably antireflective coatings, conventionally comprise a monolayer or multilayer stack of dielectric materials. These are preferably multilayer coatings, comprising layers of high refractive index (HI) and layers of low refractive index (LI).

In the present patent application, a layer of the interference coating is known as layer of high refractive index when its refractive index is greater than 1.55, preferably greater than or equal to 1.6, better still greater than or equal to 1.8 and even better still greater than or equal to 2.0. A layer of an interference coating is known as layer of low refractive index when its refractive index is less than or equal to 1.55, preferably less than or equal to 1.50 and better still less than or equal to 1.45. Unless otherwise indicated, the refractive indices to which reference is made in the present invention are expressed at 25° C. for a wavelength of 550 nm.

The HI layers are conventional layers of high refractive index, well known in the art. They generally comprise one or more mineral oxides, such as, without limitation, zirconia ($ZrO_2$), titanium dioxide ($TiO_2$), tantalum pentoxide ($Ta_2O_5$), neodymium oxide ($Nd_2O_5$), hafnium oxide ($HfO_2$), praseodymium oxide ($Pr_2O_3$), praseodymium titanate ($PrTiO_3$), $La_2O_3$, $Nb_2O_5$, $Y_2O_3$, indium oxide $In_2O_3$ or tin oxide $SnO_2$. Preferred materials are $TiO_2$, $Ta_2O_5$, $PrTiO_3$, $ZrO_2$, $SnO_2$, $In_2O_3$ and their mixtures.

The LI layers are also well-known layers and can comprise, without limitation, $SiO_2$, $MgF_2$, $ZrF_4$, alumina ($Al_2O_3$) in a small proportion, $AlF_3$ and their mixtures, preferably $SiO_2$. Use may also be made of SiOF (fluorine-doped $SiO_2$) layers. Ideally, the interference coating of the invention does not comprise any layer comprising a mixture of silica and alumina.

Generally, the HI layers have a physical thickness varying from 10 to 120 nm and the LI layers have a physical thickness varying from 10 to 120 nm, preferably from 10 to 110 nm.

The total thickness of the interference coating is preferably less than 1 micrometer, better still less than or equal to 800 nm and even better still less than or equal to 500 nm. The total thickness of the interference coating is generally greater than 100 nm, preferably greater than 150 nm.

Preferably again, the interference coating, which is preferably an antireflective coating, comprises at least two layers of low refractive index (LI) and at least two layers of high refractive index (HI). The total number of layers in the interference coating is preferably less than or equal to 8 and better still less than or equal to 6.

It is not necessary for the HI and LI layers to alternate in the interference coating, although they can be alternating according to one embodiment of the invention. Two (or more) HI layers can be deposited on one another, just as two (or more) LI layers can be deposited on one another.

According to the invention, the layers A generally constitute layers of high refractive index. The interference coating according to the invention can include one or more layers A.

In a first embodiment, all the layers of high refractive index of the interference coating are layers A.

In another embodiment of the invention, all the layers of high refractive index of the interference coating according to the invention are of inorganic nature except for a layer A (that is to say that the other layers of high refractive index of the interference coating preferably do not comprise an organic compound).

Preferably, all the layers of the interference coating according to the invention are of inorganic nature except for the layer A, which means that the layer A preferably constitutes the only layer of organic-inorganic nature of the interference coating of the invention (the other layers of the interference coating preferably not comprising an organic compound).

According to one embodiment of the invention, the interference coating comprises an underlayer. It constitutes, in this case generally, the first layer of this interference coating in the order of deposition of the layers, that is to say the layer of the interference coating which is in contact with the underlying coating (which is generally an abrasion-resistant and/or scratch-resistant coating) or with the substrate, when the interference coating is deposited directly on the substrate.

"Underlayer of the interference coating" is understood to mean a coating of relatively great thickness used with the aim of improving the resistance to abrasion and/or to scratches of said coating and/or to promote its adhesion to the substrate or to the underlying coating. The underlayer according to the invention can be chosen from the underlayers described in the application WO 2010/109154. Preferably, the underlayer has a thickness of 100 to 200 nm. It is preferably exclusively mineral/inorganic in nature and preferably consists of silica $SiO_2$.

The article of the invention can be rendered antistatic by virtue of the incorporation, preferably into the interference coating, of at least one electrically conductive layer. "Antistatic" is understood to mean the property of not retaining and/or developing an appreciable electrostatic charge. An article is generally considered as having acceptable antistatic properties when it does not attract and hold dust and small particles after one of its surfaces has been rubbed with an appropriate cloth.

The nature and the location in the stack of the electrically conductive layer which can be used in the invention are described in more detail in the application WO 2013/098531. It is preferably a layer with a thickness of 1 to 20 nm preferably comprising at least one metal oxide chosen from indium tin oxide ($In_2O_3$:Sn, indium oxide doped with tin, denoted ITO), indium oxide ($In_2O_3$) and tin oxide ($SnO_2$).

The various layers of the interference coating (of which the optional antistatic layer forms part), other than the layer(s) A, are preferably deposited by vacuum deposition according to one of the following techniques: i) by evaporation, optionally ion beam-assisted evaporation, ii) by ion beam sputtering, iii) by cathode sputtering or iv) by plasma-enhanced chemical vapor deposition. These various techniques are described in the works "Thin Film Processes" and "Thin Film Processes II", edited by Vossen and Kern, Academic Press, 1978 and 1991, respectively. A particularly recommended technique is the vacuum evaporation technique. Preferably, each of the layers of the interference coating is deposited by vacuum evaporation.

The layer A generally constitutes a layer of high refractive index within the meaning of the invention as a result of its refractive index of greater than or equal to 1.8. Preferably, according to embodiments of the invention, the refractive index of the layer A is greater than or equal to 1.9, better still greater than or equal to 2.0, even better still greater than or equal to 2.05 and ideally greater than or equal to 2.1.

The layer A is formed of a material obtained by vacuum deposition assisted by a source of ions, preferably under ion bombardment, of two categories of precursors, in particular by coevaporation of at least one titanium oxide and at least one organosilicon compound B. This technique of deposition under a beam of ions makes it possible to obtain activated entities resulting from at least one organosilicon compound B and from at least one titanium oxide, in the gaseous form.

Preferably, the deposition is carried out in a vacuum chamber comprising an ion gun directed toward the substrates to be coated, which emits, toward said substrates, a beam of positive ions generated in a plasma within the ion gun. Preferably, the ions resulting from the ion gun are particles consisting of gas atoms from which one or more electron(s) have been stripped and which are formed from a rare gas, oxygen or a mixture of two or more of these gases.

Precursors, the silico-organic compound B and the titanium oxide, are introduced or pass into a gaseous state in the vacuum chamber. They are preferably conveyed in the direction of the ion beam and are activated under the effect of the ion gun.

Without wishing to be restricted by any one theory, the inventors believe that the ion gun induces an activation/dissociation of the precursor compound B and of the precursor titanium oxide, which would form Ti—O—Si—$CH_x$ bonds.

This deposition technique using an ion gun and a gaseous precursor, sometimes denoted by "ion beam deposition", is described in particular, with only organic precursors, in U.S. Pat. No. 5,508,368.

According to the invention, preferably, the only place in the chamber where a plasma is generated is the ion gun.

The ions can, if appropriate, be neutralized before they exit the ion gun. In this case, the bombardment will still be regarded as being ion bombardment. The ion bombardment causes an atomic rearrangement in and a densification of the layer being deposited, which makes it possible to tamp it down while it is in the course of being formed.

During the implementation of the process according to the invention, the surface to be treated is preferably bombarded by ions with a current density generally of between 20 and 1000 $\mu A/cm^2$, preferably between 30 and 500 $\mu A/cm^2$ and better still between 30 and 200 $\mu A/cm^2$, over the activated surface, and generally under a residual pressure in the vacuum chamber which can range from $6 \times 10^{-5}$ mbar to $2 \times 10^{-4}$ mbar and preferably from $8 \times 10^{-5}$ mbar to $2 \times 10^{-4}$ mbar. An argon and/or oxygen ion beam is preferably used. When a mixture of argon and oxygen is employed, the $Ar/O_2$ molar ratio is preferably ≤1, better still ≤0.75 and even better still ≤0.5. This ratio can be controlled by adjusting the gas flow rates in the ion gun. The argon flow rate preferably varies from 0 to 30 sccm. The oxygen $O_2$ flow rate preferably varies from 5 to 30 sccm, and rises in proportion as the flow rate of the precursor compounds of the layer A increases.

The ions of the ion beam, preferentially resulting from an ion gun, used during the deposition of the layer A preferably have an energy ranging from 5 eV to 1000 eV, better still from 5 to 500 eV, preferentially from 75 to 150 eV, preferentially from 80 to 140 eV and better still from 90 to 110 eV. The activated entities formed are typically radicals or ions.

In the event of ion bombardment during the deposition, it is possible to carry out a plasma treatment concomitant or nonconcomitant with the deposition under an ion beam of the layer A. The layer is preferably deposited without the assistance of a plasma at the level of the substrates.

Said layer A is deposited in the presence of an oxygen source when the precursor compound B does not contain (or does not contain enough) oxygen atoms and when it is desired for the layer A to contain a certain proportion of oxygen. Likewise, said layer A is deposited in the presence of a nitrogen source when the precursor compound B does not contain (or does not contain enough) nitrogen atoms and when it is desired for the layer A to contain a certain proportion of nitrogen.

Generally, it is preferable to introduce oxygen gas with, if appropriate, a low content of nitrogen gas, preferably in the absence of nitrogen gas.

Besides the layer A, other layers of the interference coating can be deposited under ion bombardment as described above, that is to say by using bombardment by means of an ion beam of the layer being formed, which ions are preferably emitted by an ion gun.

The preferred method for the vaporization of the precursor materials of the layer A, carried out under vacuum, is physical vapor deposition, in particular vacuum evaporation, generally combined with a heating of the compounds to be evaporated. It can be deployed by using evaporation systems as diverse as a Joule-effect heat source (the Joule effect is the thermal manifestation of the electrical resistance) or an electron gun for the liquid or solid precursors, it being possible for any other device known to a person skilled in the art to also be used.

The precursor compound B of the layer A is preferably introduced in gaseous form into the vacuum chamber in which the articles according to the invention are prepared, while controlling its flow rate. This means that it is preferably not vaporized inside the vacuum chamber (in contrast to the precursor titanium oxide). The feed of the precursor compound B of the layer A is located at a distance from the outlet of the ion gun preferably varying from 30 to 50 cm.

Preferably, the titanium oxide is preheated, so as to be found in a molten state, and then evaporated. It is preferably deposited by vacuum evaporation using an electron gun in order to bring about its vaporization.

The precursor compound B and the precursor titanium oxide are preferably deposited concomitantly (for example by coevaporation) or partially concomitantly, that is to say with overlapping of the stages of deposition of both precursors. In the latter case, the deposition of one of the two precursors begins before the deposition of the other, the deposition of the second precursor beginning before the end of the deposition of the first precursor.

The organosilicon compound B, precursor of the layer A, is of organic nature and comprises, in its structure, at least one silicon atom and at least one carbon atom. It preferably comprises at least one Si—C bond and preferably comprises at least one hydrogen atom. According to one embodiment, the compound B comprises at least one nitrogen atom and/or at least one oxygen atom, preferably at least one oxygen atom.

The concentration of each chemical element (Ti, Si, O, C, H, N, and the like) in the layer A can be determined using the RBS (Rutherford Backscattering Spectrometry) technique and ERDA (Elastic Recoil Detection Analysis).

The atomic percentage of titanium atoms in the layer A preferably varies from 10 to 30%. The atomic percentage of carbon atoms in the layer A preferably varies from 10 to 20%. The atomic percentage of hydrogen atoms in the layer A preferably varies from 10 to 30%. The atomic percentage of silicon atoms in the layer A preferably varies from 10 to 20%. The atomic percentage of oxygen atoms in the layer A preferably varies from 20 to 40%.

The following compounds are nonlimiting examples of cyclic and noncyclic organic compounds B: octamethylcyclotetrasiloxane (OMCTS), decamethylcyclopentasiloxane, dodecamethylcyclohexasiloxane, hexamethylcyclotrisiloxane, hexamethyldisiloxane (HMDSO), octamethyltrisiloxane, decamethyltetrasiloxane, dodecamethylpentasiloxane, tetraethoxysilane, vinyltrimethylsilane, hexamethyldisilazane, hexamethyldisilane, hexamethylcyclotrisilazane, vinylmethyldiethoxysilane, divinyltetramethyldisiloxane, tetramethyldisiloxane, polydimethylsiloxane (PDMS), polyphenylmethylsiloxane (PPMS) or a tetraalkylsilane, such as tetramethylsilane.

Preferably, the compound B comprises at least one silicon atom carrying at least one alkyl group, preferably a $C_1$-$C_4$ alkyl group, better still at least one silicon atom carrying one or two identical or different alkyl groups, preferably $C_1$-$C_4$ alkyl groups, for example the methyl group.

The preferred precursor compounds B of the layer A comprise an Si—O—Si group, better still a divalent group of formula (3):

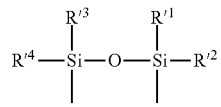

where $R'^1$ to $R'^4$ independently denote linear or branched alkyl or vinyl groups, preferably $C_1$-$C_4$ alkyl groups, for example the methyl group, monocyclic or polycyclic aryl groups, the hydroxyl group or hydrolysable groups. Nonlimiting examples of hydrolysable groups are the following groups: H, halogen (chloro, bromo, iodo, and the like), alkoxy, aryloxy, acyloxy, —NR$^1$R$^2$, where R$^1$ and R$^2$ independently denote a hydrogen atom, an alkyl group or an aryl group, and —N(R$^3$)—Si, where R$^3$ denotes a hydrogen atom, a linear or branched alkyl group, preferably a $C_1$-$C_4$ alkyl group, or a monocyclic or polycyclic aryl group, preferably a monocyclic aryl group. Groups comprising an Si—O—Si chain member are not regarded as being "hydrolysable groups" within the meaning of the invention. The preferred hydrolysable group is the hydrogen atom.

According to another embodiment, the precursor compound B of the layer A corresponds to the formula:

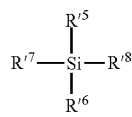

in which $R'^5$, $R'^6$, $R'^7$ and $R'^8$ independently denote hydroxyl groups or hydrolysable groups, such as OR groups, in which R is an alkyl group.

According to a first embodiment, the compound B comprises at least one silicon atom carrying two identical or different alkyl groups, preferably $C_1$-$C_4$ alkyl groups. According to this first embodiment, the compound B is preferably a compound of formula (3) in which $R'^1$ to $R'^4$ independently denote alkyl groups, preferably $C_1$-$C_4$ alkyl groups, for example the methyl group.

Preferably, the silicon atom or atoms of the compound B do not comprise any hydrolysable group or hydroxyl group in this embodiment.

The silicon atom or atoms of the precursor compound B of the layer A are preferably solely bonded to alkyl groups and/or groups comprising an —O—Si or —NH—Si chain member, so as to form an Si—O—Si or Si—NH—Si group. The preferred precursor compounds of the layer A are OMCTS and HMDSO.

It preferably concerns a cyclic polysiloxane of formula (4):

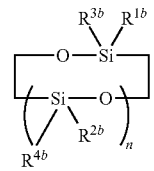

where n designates an integer ranging from 2 to 20, preferably from 3 to 8, and $R^{1b}$ to $R^{4b}$ independently represent linear or branched alkyl groups, preferably $C_1$-$C_4$ alkyl groups (for example the methyl group), vinyl, aryl or a hydrolysable group. The preferred members belonging to this group are octaalkylcyclotetrasiloxanes (n=3), preferably octamethylcyclotetrasiloxane (OMCTS). In some cases, the layer A results from a mixture of a certain number of compounds of formula (4), where n can vary within the limits indicated above.

According to a second embodiment, the compound B comprises, in its structure, at least one Si—X' group, where X' is a hydroxyl group or a hydrolysable group, which can be chosen, without limitation, from the following groups: H, halogen, alkoxy, aryloxy, acyloxy, —NR$^1$R$^2$, where R$^1$ and R$^2$ independently denote a hydrogen atom, an alkyl group or an aryl group, and —N(R$^3$)—Si, where R$^3$ denotes a hydrogen atom, an alkyl group or an aryl group.

According to this second embodiment of the invention, the compound B preferably comprises, in its structure, at least one Si—H group, that is to say constitutes a silicon hydride. Preferably, the silicon atom of the Si—X' group is not bonded to more than two non-hydrolysable groups, such as alkyl or aryl groups.

Among the X' groups, the acyloxy groups preferably have the formula —O—C(O)R$^4$, where R$^4$ is an aryl group, preferably a $C_6$-$C_{12}$ aryl group, optionally substituted by one or more functional groups, or an alkyl group, preferably a linear or branched $C_1$-$C_6$ alkyl group, optionally substituted by one or more functional groups and additionally being able to comprise one or more double bonds, such as the phenyl, methyl or ethyl groups, the aryloxy and alkoxy groups have the formula —O—R$^5$, where R$^5$ is an aryl group, preferably a $C_6$-$C_{12}$ aryl group, optionally substituted by one or more functional groups, or an alkyl group, preferably a linear or branched $C_1$-$C_6$ alkyl group, optionally substituted by one or more functional groups and additionally being able to comprise one or more double bonds, such as the phenyl, methyl or ethyl groups, the halogens are preferably F, Cl, Br or I, the X' groups of formula —NR$^1$R$^2$ can denote an amino NH$_2$, alkylamino, arylamino, dialkylamino or diarylamino group, R$^1$ and R$^2$ independently denoting a hydrogen atom, an aryl group, preferably a C$_6$-C$_{12}$ aryl group, optionally substituted by one or more functional groups, or an alkyl group, preferably a linear or branched C$_1$-C$_6$ alkyl group, optionally substituted by one or more functional groups and additionally being able to comprise one or more double bonds, such as the phenyl, methyl or ethyl groups, the X' groups of formula —N(R$^3$)—Si are attached to the silicon atom via their nitrogen atom and their silicon atom naturally comprises three other substituents, where R$^3$ denotes a hydrogen atom, an aryl group, preferably a C$_6$-C$_{12}$ aryl group, optionally substituted by one or more functional groups, or an alkyl group, preferably a linear or branched C$_1$-C$_6$ alkyl group, optionally substituted by one or more functional groups and additionally being able to comprise one or more double bonds, such as the phenyl, methyl or ethyl groups.

The preferred acyloxy group is the acetoxy group. The preferred aryloxy group is the phenoxy group. The preferred halogen is the Cl group. The preferred alkoxy groups are the methoxy and ethoxy groups.

In the second embodiment, the compound B preferably comprises at least one silicon atom carrying at least one linear or branched alkyl group, preferably C$_1$-C$_4$ alkyl group, better still at least one silicon atom carrying one or two identical or different alkyl groups, preferably C$_1$-C$_4$ alkyl groups, and an X' group (preferably a hydrogen atom) directly bonded to the silicon atom, X' having the meaning indicated above. The preferred alkyl group is the methyl group. The vinyl group can also be used instead of an alkyl group. Preferably, the silicon atom of the Si—X' group is directly bonded to at least one carbon atom.

Preferably, each silicon atom of the compound B is not directly bonded to more than two X' groups, better still is not directly bonded to more than one X' group (preferably a hydrogen atom) and better still each silicon atom of the compound B is directly bonded to a single X' group (preferably a hydrogen atom). Preferably, the compound B comprises an Si/O atomic ratio equal to 1. Preferably the compound B comprises a C/Si atomic ratio <2, preferably ≤1.8, better still ≤1.6 and even better still ≤1.5, ≤1.3 and optimally equal to 1. Preferably again, the compound B comprises a C/O atomic ratio equal to 1. According to one embodiment, the compound B does not comprise an Si—N group and better still does not comprise a nitrogen atom.

The silicon atom or atoms of the precursor compound B of the layer A are preferably solely bonded to alkyl or hydrogen groups and/or groups comprising an —O—Si or —NH—Si chain member, so as to form an Si—O—Si or Si—NH—Si group. In one embodiment, the compound B comprises at least one Si—O—Si—X' group or at least one Si—NH—Si—X' group, X' having the meaning indicated above and preferably representing a hydrogen atom.

According to this second embodiment, the compound B is preferably a compound of formula (3) in which at least one of R'$^1$ to R'$^4$ denotes an X' group (preferably a hydrogen atom), X' having the meaning indicated above.

According to this second embodiment, the compound B is preferably a cyclic polysiloxane of formula (5):

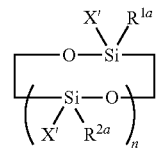

where X' has the meaning indicated above and preferably represents a hydrogen atom, n designates an integer ranging from 2 to 20, preferably from 3 to 8, and R$^{1a}$ and R$^{2a}$ independently represent an alkyl group, preferably a C$_1$-C$_4$ alkyl group (for example the methyl group), vinyl, aryl or a hydrolysable group. Nonlimiting examples of hydrolysable X' groups are the chloro, bromo, alkoxy, acyloxy, aryloxy and H groups. The commonest members belonging to this group are the tetra-, penta- and hexaalkylcyclotetrasiloxanes, preferably the tetra-, penta- and hexamethylcyclotetrasiloxanes, 2,4,6,8-tetramethylcyclotetrasiloxane (TMCTS) being the preferred compound. In some cases, the layer A results from a mixture of a certain number of compounds having the above formula, where n can vary within the limits indicated above.

According to another embodiment, the compound B is a linear alkylhydrosiloxane, better still a linear methylhydrosiloxane, such as, for example, 1,1,1,3,5,7,7,7-octamethyltetrasiloxane, 1,1,1,3,5,5,5-heptamethyltrisiloxane or 1,1,3,3,5,5-hexamethyltrisiloxane.

The following compounds are nonlimiting examples of cyclic and noncyclic organic precursor compounds B of the layer A in accordance with the second embodiment: 2,4,6,8-tetramethylcyclotetrasiloxane (TMCTS of formula (1)), 2,4,6,8-tetraethylcyclotetrasiloxane, 2,4,6,8-tetraphenylcyclotetrasiloxane, 2,4,6,8-tetraoctylcyclotetrasiloxane, 2,2,4,6,6,8-hexamethylcyclotetrasiloxane, 2,4,6-trimethylcyclotrisiloxane, cyclotetrasiloxane, 1,3,5,7,9-pentamethylcyclopentasiloxane, 2,4,6,8,10,12-hexamethylcyclohexasiloxane, 1,1,1,3,5,7,7,7-octamethyltetrasiloxane, 1,1,3,3,5,5-hexamethyltrisiloxane, tetramethyldisiloxane, tetraethoxysilane, vinylmethyldiethoxysilane, a hexamethylcyclotrisilazane, such as 1,2,3,4,5,6-hexamethylcyclotrisilazane or 2,2,4,4,6,6-hexamethylcyclotrisilazane, 1,1,1,3,5,5,5-heptamethyltrisiloxane, tris (trimethylsiloxy)silane (of formula (2)), 1,1,3,3-tetramethyldisilazane, 1,2,3,4,5,6,7,8-octamethylcyclotetrasilazane, nonamethyltrisilazane, tris (dimethylsilyl)amine or hexamethyldisilazane.

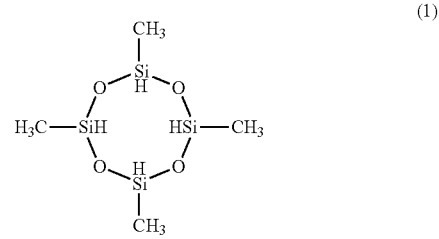

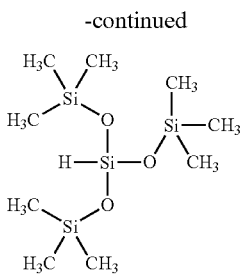

(2)

The titanium oxide precursor of the layer A can be titanium dioxide $TiO_2$ or a substoichiometric titanium oxide of formula $TiO_x$ with x<2, x preferably varying from 0.2 to 1.2. The titanium oxide of the invention preferably does not comprise nitrogen.

According to the preferred embodiment, the titanium oxide is a substoichiometric titanium oxide. It can in particular concern TiO, $Ti_2O_3$ or $Ti_3O_5$. As stated above, the layer A can be formed from one or more titanium oxides, for example a mixture of TiO and $Ti_2O_3$, in particular by coevaporation of these compounds. Preferably, the proportion by weight of TiO in the mixture of TiO and $Ti_2O_3$ is at least 50%, preferably at least 60% and better still at least 70%.

The use of titanium oxide is advantageous due to the high refractive index of this metal oxide. The refractive index of $TiO_2$ in the rutile form is effectively of the order of 2.65 at 550 nm. Thus, the layer A can retain a high refractive index (≥1.8), even if the titanium oxide is mixed with an organosilicon compound B of lower refractive index.

The use of at least one compound B to form the layer A, which comprises in particular Si—C and optionally Si—O bonds, makes it possible to benefit from improved thermomechanical properties with respect to the conventional materials of high refractive index, such as $TiO_2$ or $ZrO_2$; in particular, the thermal resistance and the scratch resistance of the substrates coated with the layers A according to the invention make it possible to achieve levels hitherto inaccessible by conventional technologies, such as the ion-assisted deposition of purely inorganic layers.

According to one embodiment of the invention, the layer A comprises more than 80% by weight, preferably more than 90% by weight, of compounds resulting from compound B and titanium oxide according to the invention, with respect to the total weight of the layer A. According to one embodiment, the layer A is exclusively formed by vacuum deposition under ion bombardment of at least one titanium oxide and of at least one organosilicon compound B, with the exclusion of any other precursor. Preferably, the layer A does not comprise a fluorinated compound.

Preferably, the layer A does not comprise a separate metal oxide phase. As the layer A is formed by vacuum deposition, it does not comprise organosilicon compound hydrolysate and thus differs from sol-gel coatings obtained by the liquid route.

The duration of the deposition process, the flow rates and the pressures are adjusted so as to obtain the desired coating thickness.

The layer A preferably possesses a thickness ranging from 20 to 150 nm, better still from 25 to 120 nm and even better still from 60 to 100 nm.

The deposition conditions, in particular the relative proportions of the compound B and of the titanium oxide, are chosen so that there is obtained, after the deposition of the two precursors, a layer A exhibiting:
 a refractive index at 550 nm of greater than or equal to 1.8,
 an extinction coefficient k at 550 nm of less than or equal to 0.02, which means that the layer A is weakly absorbent,
 an H/E ratio of greater than or equal to 0.046, better still of greater than or equal to 0.05, where H and E respectively denote the hardness of the material and the modulus of elasticity of the material expressed, H and E preferably being expressed in MPa or GPa,
 preferably a static contact angle with water of greater than or equal to 70°, better still of greater than or equal to 80° and even better still of greater than or equal to 90°, preferably varying from 70 to 95°,
 preferably a stress varying from −350 MPa to +150 MPa.

The nature of the compounds employed, their respective amounts (which can be modulated by adjusting the evaporated flows) and the duration of the deposition are examples of parameters which a person skilled in the art will know how to vary in order to arrive at the coating having the desired properties, in particular with the help of the examples of the present patent application.

The extinction coefficient (also known as attenuation coefficient) of a particular substance, denoted k, measures the loss in energy of electromagnetic radiation traversing this medium. This is the imaginary part of the complex refractive index. Preferably, the layers A according to the invention have an extinction coefficient k of less than or equal to 0.02 for any wavelength ranging from 400 to 800 nm.

The modulus of elasticity E of the material forming the layer A and its hardness H are measured by an instrument-controlled penetration test (indentation), according to a method described in detail in the experimental part. If need be, reference will be made to the standard NF EN ISO 14577. The hardness H characterizes the ability of the material to withstand a permanent indentation or a deformation when it is brought in contact with an indenter under a compression load. The modulus of elasticity E (or Young's modulus, or storage modulus, or tensile modulus of elasticity) makes it possible to evaluate the ability of the material to deform under the effect of a force applied. The H/E ratio expresses the fracture resistance (resistance to the propagation of the crack).

The layer and the articles according to the invention exhibit a good fracture resistance.

The modulus of elasticity E of the material forming the layer A preferably varies from 60 MPa to 120 MPa.

Other properties to be taken into account during the design of an article according to the invention, for example comprising an interference coating, are the mechanical stresses. The stress of the layer A preferably varies from −350 MPa to +150 MPa, better still from −200 to −50 MPa, which means that it is lower than that of a purely inorganic layer of $TiO_2$ deposited by ion-assisted evaporation. It is measured at a temperature of 20° C. and under a relative humidity of 50% in the way described in the application WO 2013/098531. It is the deposition conditions of the invention which make it possible for this stress to be achieved.

The stress of the interference coating according to the invention generally varies from 0 to −400 MPa, preferably from −50 to −300 MPa, better still from −80 to −250 MPa and even better still from −100 to −200 MPa.

The layers A of the invention possess greater elongations at break than those of inorganic layers and can undergo deformations without cracking. For this reason, the article according to the invention possesses an increased resistance to curvature.

The critical temperature of a coated article according to the invention is preferably greater than or equal to 70° C., better still greater than or equal to 80° C. and even better still greater than or equal to 90° C. In the present patent application, the critical temperature of an article or a coating is defined as being the temperature starting from which cracks are observed to appear in the stack present at the surface of the substrate, which results in degradation of the coating. This high critical temperature is due to the presence of the layer A at the surface of the article, as demonstrated in the experimental part. Furthermore, the layers A obtained possess a poorer ability to become loaded with water than evaporated inorganic layers. The layers A obtained according to the invention, incorporated or not in an interference coating, have an excellent stability of their optical properties over time.

By virtue of its improved thermomechanical properties, the layer A, forming or not forming part of an interference coating, can in particular be applied to a single face of a semi-finished lens, generally its front face, the other face of this lens still having to be machined and treated. The stack present on the front face of the lens will not be degraded by the increase in temperature generated by the treatments to which the back face will be subjected during the curing of the coatings which will have been deposited on this back face or any other action liable to increase the temperature of the lens.

According to a preferred embodiment, the interference coating of the invention is an antireflective coating comprising, in the order of deposition on the surface of the optionally coated substrate, a $ZrO_2$ layer which is generally from 10 to 40 nm in thickness and preferably from 15 to 35 nm in thickness, an $SiO_2$ layer which is generally from 10 to 40 nm in thickness and preferably from 15 to 35 nm in thickness, a layer A which is generally from 40 to 150 nm in thickness and preferably from 50 to 120 nm in thickness, an ITO or $SnO_2$ layer which is generally from 1 to 15 nm in thickness and preferably from 2 to 10 nm in thickness, and an $SiO_2$ layer which is generally from 50 to 150 nm in thickness and preferably from 60 to 100 nm in thickness.

Preferably, the average reflection factor in the visible region (400-700 nm) of an article coated with an interference coating according to the invention, denoted $R_m$, is less than 2.5% per face, better still less than 2% per face and even better still less than 1% per face of the article. In an optimal embodiment, the article comprises a substrate, the two main surfaces of which are coated with an interference coating according to the invention and which exhibits a total $R_m$ value (cumulative reflection due to the two faces) of less than 1%. Means for achieving such $R_m$ values are known to a person skilled in the art.

The light reflection factor $R_v$ of an interference coating according to the invention is less than 2.5% per face, preferably less than 2% per face, better still less than 1% per face of the article, better still ≤0.75% and even better still ≤0.5%.

In the present patent application, the "average reflection factor" $R_m$ (average of the spectral reflection over the entire visible spectrum between 400 and 700 nm) and the "light reflection factor" $R_v$ are as defined in the standard ISO 13666:1998 and are measured according to the standard ISO 8980-4.

In some applications, it is preferable for the main surface of the substrate to be coated with one or more functional coatings prior to the deposition of the layer A or of the multilayer coating comprising the layer A. These functional coatings conventionally used in optics can be, without limitation, a primer layer which improves the impact strength and/or the adhesion of the subsequent layers in the final product, an abrasion-resistant and/or scratch-resistant coating, a polarized coating, a photochromic or electrochromic coating or a colored coating, in particular a primer layer coated with an abrasion-resistant and/or scratch-resistant layer. The last two coatings are described in more detail in the applications WO 2008/015364 and WO 2010/109154.

The article according to the invention can also comprise coatings, formed on the layer A or the multilayer coating comprising it, capable of modifying its surface properties, such as a hydrophobic and/or oleophobic coating (anti-smudge top coat) or an anti-fogging coating. These coatings are preferably deposited on the layer A or the external layer of an interference coating. They are generally less than or equal to 10 nm in thickness, preferably from 1 to 10 nm in thickness and better still from 1 to 5 nm in thickness. They are described in the applications WO 2009/047426 and WO 2011/080472 respectively.

Hydrophobic and/or oleophobic coatings are defined as coatings, the static contact angle with deionized water of which is greater than or equal to 75°, preferably greater than or equal to 90° and better still greater than or equal to 100°. In the present patent application, the static contact angles can be determined according to the liquid droplet method, according to which a liquid drop having a diameter of less than 2 mm is deposited gently on a nonabsorbent solid surface and the angle at the interface between the liquid and the solid surface is measured.

The hydrophobic and/or oleophobic coating is preferably a coating of fluorosilane or fluorosilazane type. It can be obtained by deposition of a fluorosilane or fluorosilazane precursor, preferably comprising at least two hydrolysable groups per molecule. The fluorosilane precursors preferably comprise fluoropolyether groups and better still perfluoropolyether groups.

Preferably, the hydrophobic and/or oleophobic external coating has a surface energy of less than or equal to 14 $mJ/m^2$, preferably of less than or equal to 13 $mJ/m^2$ and better still of less than or equal to 12 $mJ/m^2$. The surface energy is calculated according to the Owens-Wendt method described in the reference: "Estimation of the surface force energy of polymers", Owens D. K. and Wendt R. G. (1969), J. Appl. Polym. Sci., 13, 1741-1747. The liquids used are water and diiodomethane.

Compounds which can be used to obtain such coatings are described in the patents JP 2005187936 and U.S. Pat. No. 6,183,872. Commercially available compositions which make it possible to prepare hydrophobic and/or oleophobic coatings are the composition KY130® from Shin-Etsu Chemical or the composition OPTOOL DSX® sold by Daikin Industries.

Typically, an article according to the invention comprises a substrate successively coated with a layer of adhesion and/or impact-resistant primer, with an abrasion-resistant and/or scratch-resistant coating, with an optionally antistatic interference coating comprising a layer A according to the invention, and with a hydrophobic and/or oleophobic coating.

The invention is illustrated in a nonlimiting way by the following examples. Unless otherwise indicated, the refractive indices are given for a wavelength of 550 nm and T=20-25° C.

EXAMPLES

1. General Procedures

The articles employed in the examples comprise an Orma® Essilor lens substrate with a diameter of 65 mm, with a power of −2.00 dioptres and with a thickness of 1.2 mm, coated on its concave face with the impact-resistant primer coating and with the scratch-resistant and abrasion-resistant coating (hard coat), which are disclosed in the experimental section of the application WO 2010/109154, and a layer A according to the invention.

The vacuum deposition reactor is a Leybold Boxer pro device equipped with an electron gun for the evaporation of the precursor materials, with a thermal evaporator, with a KRI EH 1000 F ion gun (from Kaufman & Robinson Inc.), for the preliminary phase of preparation of the surface of the substrate by argon ions (IPC) and also for the deposition of the layer A under ion bombardment (IAD), and with a system for the introduction of liquid, which system is used when the precursor compound of the layer A is a liquid under standard temperature and pressure conditions (case of OMCTS). This system comprises a tank containing the liquid precursor compound of the layer A, resistance heaters for heating the tank, tubes connecting the tank of liquid precursor to the vacuum deposition device and a vapor flowmeter from MKS (MKS1150C), brought to a temperature of 30-120° C. during its use, depending on the flow rate of vaporized OMCTS, which preferably varies from 0.01 to 0.8 g/min (the temperature is 100° C. for a flow rate of 0.3 g/min of OMCTS).

The OMCTS vapor exits from a copper pipe inside the device, at a distance of approximately 30 cm from the ion gun. Flows of oxygen and optionally of argon are introduced into the ion gun. Preferably, neither argon nor any other rare gas is introduced into the ion gun.

The layers A according to the invention are formed by vacuum evaporation assisted by a beam of oxygen and optionally argon ions during the deposition (evaporation source: electron gun) of octamethylcyclotetrasiloxane supplied by Sigma-Aldrich and of a substoichiometric titanium oxide ("stabilized $Ti_3O_5$") supplied by Merck.

Unless otherwise indicated, the thicknesses mentioned are physical thicknesses. Several samples of each glass were prepared.

2. Procedures

The process for the preparation of the optical articles according to the invention comprises the introduction of the substrate, coated with the primer coating and with the abrasion-resistant coating which are defined above, into the vacuum deposition chamber; the preheating of the tank, the pipes and the vapor flowmeter to the chosen temperature (~15 min), a primary pumping stage, then a secondary pumping stage for 400 seconds making it possible to obtain a high vacuum (~2×10$^{-5}$ mbar, pressure read from a Bayard-Alpert gauge); a stage of activation of the surface of the substrate by a beam of argon ions (IPC: 1 minute, 100 V, 1 A, the ion gun remaining in operation at the end of the stage) and then the vapor deposition of the layer A, carried out in the following way.

The ion gun having been started with argon, oxygen is added to the ion gun with a programmed flow rate, the desired anode current (3 A) is programmed and the argon flow is optionally halted, depending on the deposition conditions desired. Generally, the process according to the invention is carried out with oxygen ($O_2$) introduced into the ion gun, in the absence of rare gas.

The substoichiometric titanium oxide is preheated so as to be in a molten state and then evaporated using an electron gun, the shutter of the ion gun and that of the electron gun being opened simultaneously. At the same time, the OMCTS compound is introduced into the chamber in the gaseous form, at a controlled flow rate or partial pressure.

The thickness of the layers deposited was controlled in real-time by means of a quartz microbalance, the rate of deposition being modified, if need be, by adjusting the current of the electron gun. Once the desired thickness is obtained, the two shutters are closed, the ion and electron guns are switched off and the gas flows (oxygen, optionally argon and OMCTS vapors) are halted.

Finally, a venting stage is carried out.

Comparative example 1 differs from the stack according to the invention in that the layer A is replaced with a layer obtained from the single precursor $Ti_3O_5$.

Comparative example 2 differs from the stack according to the invention in that the layer A is replaced with a layer obtained from the single precursor ZrO.

Comparative examples 3-5 differ from the stacks according to the invention in that the layer A is replaced with a layer obtained from the precursors ZrO and OMCTS.

3. Characterizations

The critical temperature of the article is measured 24 hours after its preparation, in the way indicated in the application WO 2008/001011.

The measurements of refractive index n and of extinction coefficient k (defined in the application WO 2005/059603) were carried out by ellipsometry at the wavelength of 550 nm.

More specifically, the refractive index and the extinction coefficient are obtained by ellipsometric measurements using an ellipsometer (RC2, J. A. Woollam) equipped with a dual rotating compensator. The refractive index and the extinction coefficient are deduced from the dispersion relationship which models the optical response provided by the ellipsometric angles Ψ and Δ. For dielectric materials, such as $TiO_2$, the Tauc-Lorentz equation, known to a person skilled in the art, models well the optical properties of the layers deposited. All the measurements were carried out at angles of incidence of 45°, 55°, 65° and 75° in a range of wavelengths of 190-1700 nm.

The hardness H and the modulus of elasticity E of the material constituting the layer A were evaluated by nanoindentation measurement. This consists in causing a tip, also known as indenter, of known geometry and mechanical properties, namely a Berkovich diamond tip, to penetrate under a force varying from 100 μN to 10 000 μN into a layer of material A with a thickness of 500 nm deposited on a "silicon wafer" silica support and recording the force applied as a function of the depth of penetration h of the tip. These two parameters are measured continuously during a loading phase and an unloading phase, in order to deduce therefrom the mechanical properties of the layer A.

The model used for the calculation of the hardness and of the elastic modulus is that developed by Oliver and Pharr.

The area of contact ($A_c$) for a Berkovich indenter is $A_c = 24.56 \times h_c^2$.

The hardness of the material is obtained by calculating the ratio of the maximum force applied to the surface area measured (area of contact $A_c$ between the indenter and the sample), $$H = \frac{F_{max}}{A_c} \quad h_c = h_{max} - \varepsilon \cdot \frac{F_{max}}{S}$$

and the modulus of elasticity E is deduced from the indentation curve (force-penetration curve).

$$S = \frac{\partial F}{\partial h} = \frac{2}{\sqrt{\pi}} \cdot E_r \cdot \sqrt{A_c}$$

$$\frac{1}{E_r} = \frac{1-v_i^2}{E_i} + \frac{1-v^2}{E}$$

$E_r$ is the reduced modulus, $E_i$ is the modulus of the indenter and $\upsilon$ is the Poisson coefficient.

The measuring device used is a TriboIndenter device of the Hysitron brand.

4. Results

The optical and mechanical performances of different articles, according to the invention or comparative, and also the conditions for the deposition of the different layers are presented in table 1 below.

TABLE 1

| Example | Inorganic precursor | Rate of deposition by weight [μg/cm²/s] | OMCTS partial pressure [mTorr] | Oxygen/argon flow rate [sccm] | Anode current [A] | Refractive index at 550 nm | k at 550 nm | Critical T [° C.] | H/E |
|---|---|---|---|---|---|---|---|---|---|
| 1 | Ti₃O₅ | 0.2 | 0.05 | 20/0 | 3 | 2.09 | 0.004 | 90 | 0.051 |
| 2 | Ti₃O₅ | 0.2 | 0.1 | 30/0 | 3 | 1.9 | 0.02 | 70 | 0.047 |
| 3 | Ti₃O₅ | 0.2 | 0.02 | 20/0 | 3 | 2.13 | <10⁻⁴ | | 0.053 |
| 4 | Ti₃O₅ | 0.1 | 0.05 | 20/0 | 4 | 2.03 | <10⁻⁴ | | 0.062 |
| C1 | Ti₃O₅ | 0.2 | 0 | 30/0 | 3 | 2.25 | <10⁻⁴ | 50 | 0.039 |
| C2 | ZrO | 20** | 0 | 16/0 | 0 | 2.02 | 0.004 | 50 | 0.038 |
| C3 | ZrO | 20** | 0.1* | 10/10 | 3 | 1.73 | 0.002 | | 0.057 |
| C4 | ZrO | 20** | 0.2* | 10/10 | 3 | 1.60 | 4.10⁻⁴ | | 0.054 |
| C5 | ZrO | 20** | 0.5* | 10/10 | 3 | 1.49 | 0.003 | | 0.066 |

*OMCTS flow rate in g/min
**Rate of deposition in Å/s (programmed value).

The articles according to the invention exhibit a critical temperature and an H/E ratio which are markedly improved with respect to a layer exclusively composed of titanium oxide (comparative example C1), while retaining a relatively low extinction coefficient at 550 nm and a high refractive index.

The refractive index of the hybrid layers based on metal oxides of high refractive index naturally decreases when the OMCTS flow rate is increased.

The coevaporation of OMCTS and of premelted ZrO results in hybrid layers based on zirconia which are not satisfactory (comparative examples C3-C5) as a result of an excessively low refractive index, even for a very low OMCTS flow rate (0.1 g/min, comparative example C3).

In addition, it has been confirmed that the stacks according to the invention withstand exposure to UV radiation while retaining stable optical and mechanical properties.

The invention claimed is:

1. An article comprising a substrate having at least one main surface coated with a layer A of a material obtained by ion beam deposition under vacuum of at least one titanium oxide and at least one organosilicon compound wherein said material exhibits:
   a refractive index at 550 nm of greater than or equal to 1.8,
   an extinction coefficient k at 550 nm of less than or equal to 0.02,
   an H/E ratio of greater than or equal to 0.046, where H and E respectively denote the hardness of the material and the modulus of elasticity of the material, wherein the hardness H and the modulus of elasticity E are evaluated by nano-indentation measurement on a 500 nm thick coating of layer A on a silicon wafer support, wherein the nano-indentation measurement comprises causing a Berkovich diamond tip to penetrate the layer A under a force varying from 100 μN to 10,000 μN and continuously recording the force, F, applied as a function of the depth of penetration, h, of the tip to obtain a force-penetration curve and applying the force-penetration curve to the following formulae:

$$A_c = 24.56 \times h_c^2$$

$$H = \frac{F_{max}}{A_c} \quad h_c = h_{max} - \varepsilon \cdot \frac{F_{max}}{S}$$

$$S = \frac{\partial F}{\partial h} = \frac{2}{\sqrt{\pi}} \cdot E_r \cdot \sqrt{A_c}$$

$$\frac{1}{E_r} = \frac{1-v_i^2}{E_i} + \frac{1-v^2}{E}$$

wherein $h_{max}$ is the maximum depth of penetration, $F_{max}$ is the maximum force, ε is the indenter geometry constant, $E_r$ is the reduced modulus, $E_i$ is the modulus of the indenter and v is the Poisson coefficient, wherein the atomic percentage of titanium atoms in layer A ranges from 10 to 30%, the atomic percentage of carbon atoms in layer A ranges from 10 to 20%, the atomic percentage of silicon atoms in layer A ranges from 10 to 20%, the atomic percentage of oxygen atoms in layer A ranges from 20 to 40%, and the atomic percentage of hydrogen atoms in layer A ranges from 10 to 30%.

2. The article of claim 1, wherein the deposition comprises ion bombardment.

3. The article of claim 1, wherein the organosilicon compound comprises at least one Si—C bond.

4. The article of claim 1, wherein the organosilicon compound comprises at least one divalent group of formula:

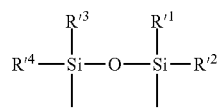

where $R'^1$ to $R'^4$ independently denote alkyl, vinyl, aryl or hydroxyl groups or hydrolysable groups, or in that the organosilicon compound corresponds to the formula:

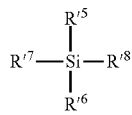

in which $R'^5$, $R'^6$, $R'^7$ and $R'^8$ independently denote hydroxyl groups or hydrolysable groups.

5. The article of claim 1, wherein the organosilicon compound is chosen from octamethylcyclotetrasiloxane, 2,4,6,8-tetramethylcyclotetrasiloxane, decamethyltetrasiloxane, decamethylcyclopentasiloxane, dodecamethylpentasiloxane or hexamethyldisiloxane.

6. The article of claim 1, wherein the silicon atom or atoms of the organosilicon compound do not comprise any hydrolysable group or hydroxyl group.

7. The article of claim 1, wherein the titanium oxide is a substoichiometric titanium oxide of formula $TiO_x$ with x<2.

8. The article of claim 1, wherein the layer A has a thickness ranging from 20 to 150 nm.

9. The article of claim 1, wherein the layer A constitutes a layer of a multilayer interference coating.

10. The article of claim 9, wherein the interference coating is an antireflective coating.

11. The article of claim 1, further defined as an ophthalmic lens.

12. The article of claim 1, further defined as possessing a critical temperature of greater than or equal to 70° C.

13. The article of claim 4, wherein the hydrolysable groups are OR groups, in which R is an alkyl group.

14. A process for the manufacture of an article according to claim 1, comprising:

providing an article comprising the substrate having at least one main surface;

depositing, on said main surface of the substrate, the layer A of the material having the refractive index of greater than or equal to 1.8, the extinction coefficient k at 550 nm of less than or equal to 0.02 and the H/E ratio of greater than or equal to 0.046, where H and E respectively denote the hardness of the material and the modulus of elasticity of the material, recovering the article comprising the substrate having the at least one main surface coated with the layer A, the layer A having been obtained by ion beam deposition under vacuum of at least one titanium oxide and at least one organosilicon compound.

* * * * *